US008494109B2

(12) United States Patent
Ohara

(10) Patent No.: US 8,494,109 B2
(45) Date of Patent: Jul. 23, 2013

(54) SHIFT REGISTER

(75) Inventor: Masanori Ohara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/579,572

(22) PCT Filed: Oct. 14, 2010

(86) PCT No.: PCT/JP2010/068019
§ 371 (c)(1),
(2), (4) Date: Aug. 17, 2012

(87) PCT Pub. No.: WO2011/114563
PCT Pub. Date: Sep. 22, 2011

(65) Prior Publication Data
US 2012/0326955 A1    Dec. 27, 2012

(30) Foreign Application Priority Data

Mar. 19, 2010    (JP) .................................. 2010-063492

(51) Int. Cl.
*G11C 19/00*    (2006.01)
(52) U.S. Cl.
USPC ............. 377/64; 377/68; 377/78; 377/79
(58) Field of Classification Search
USPC .................... 377/64, 68, 69, 78–80
See application file for complete search history.

(56) References Cited

U.S. PATENT DOCUMENTS

| 5,222,082 | A | 6/1993 | Plus |
| 5,434,899 | A | 7/1995 | Huq et al. |
| 5,631,940 | A | 5/1997 | Fujikura |
| 5,949,398 | A | 9/1999 | Kim |
| 7,460,634 | B2 * | 12/2008 | Deane ............................. 377/64 |
| 7,627,076 | B2 * | 12/2009 | Tobita ............................ 377/64 |
| 7,738,623 | B2 * | 6/2010 | Tobita ............................ 377/64 |
| 7,949,086 | B2 * | 5/2011 | Tsai et al. ...................... 377/64 |
| 8,107,586 | B2 * | 1/2012 | Shin et al. ..................... 377/64 |
| 2003/0231735 | A1 | 12/2003 | Moon et al. |
| 2004/0165692 | A1 | 8/2004 | Moon et al. |

(Continued)

FOREIGN PATENT DOCUMENTS

JP    08-087897 A    4/1996
JP    08-273387 A    10/1996

(Continued)

OTHER PUBLICATIONS

Official Communication issued in International Patent Application No. PCT/JP2010/068019, mailed on Jan. 25, 2011.

*Primary Examiner* — Tuan T Lam
(74) *Attorney, Agent, or Firm* — Keating & Bennett, LLP

(57) ABSTRACT

Provided is a shift register configured by cascade-connecting unit circuits 11 each including a compensation circuit 21. The compensation circuit 21 applies an overshoot potential Vos (compensation potential) that is lower than a low level potential to an additional output terminal Z, when a second reset signal R2 outputted from a second next stage unit circuit becomes a high level. To a gate terminal of a TFT T8 (output reset transistor), a signal outputted from the additional output terminal Z included in a next stage unit circuit is supplied. Selectively applying a high level potential and a compensation potential of a polarity opposite to the high level potential to the gate terminal of the TFT T8 allows to reduce a threshold voltage shift of the TFT T8 and to prevent a reset time of the output signal from becoming long over time.

16 Claims, 12 Drawing Sheets

U.S. PATENT DOCUMENTS

| | | |
|---|---|---|
| 2006/0071923 A1 | 4/2006 | Lee et al. |
| 2007/0086558 A1 | 4/2007 | Wei et al. |
| 2010/0277206 A1 | 11/2010 | Lee et al. |
| 2010/0328281 A1 | 12/2010 | Okada et al. |
| 2011/0199354 A1 | 8/2011 | Iwase et al. |
| 2012/0242630 A1* | 9/2012 | Ohara .......................... 345/204 |

FOREIGN PATENT DOCUMENTS

| | | |
|---|---|---|
| JP | 10-031202 A | 2/1998 |
| JP | 2004-078172 A | 3/2004 |
| JP | 2004-246358 A | 9/2004 |
| JP | 2006-107692 A | 4/2006 |
| JP | 2007-114781 A | 5/2007 |
| JP | 2010-262296 A | 11/2010 |
| JP | 2011-008104 A | 1/2011 |
| WO | 92/15992 A1 | 9/1992 |
| WO | 2010/067641 A1 | 6/2010 |
| WO | 2011/080936 A1 | 7/2011 |

\* cited by examiner

A : PRECHARGE PERIOD
B : MAIN CHARGE PERIOD

SHIFT REGISTER

TECHNICAL FIELD

The present invention relates to shift registers, and in particular to a shift register suitably used as a drive circuit for a display device, for example.

BACKGROUND ART

An active matrix-type display device selects two-dimensionally arranged pixel circuits by row, and writes gradation voltages to the selected pixel circuits according to a video signal, thereby displaying an image. Such a display device is provided with a scanning signal line drive circuit including a shift register, in order to select the pixel circuits by row.

Further, as a method of downsizing display devices, there is known a method of monolithically forming a scanning signal line drive circuit on a display panel along with pixel circuits using a manufacturing process of forming TFTs (Thin Film Transistors) within the pixel circuit. The scanning signal line drive circuit is formed using an amorphous silicon TFT or a microcrystalline silicon TFT, for example. A display panel having a scanning signal line drive circuit monolithically formed is also referred to as a gate driver monolithic panel.

As a shift register included in the scanning signal line drive circuit, various circuits have been known conventionally (Patent Documents 1 to 4, for example). Patent Document 1 describes a shift register having a plurality of unit circuits 91 illustrated in FIG. 17 connected in series. This shift register is monolithically formed on a liquid crystal panel using amorphous silicon TFTs.

PRIOR ART DOCUMENTS

Patent Documents

[Patent Document 1] Japanese Laid-Open Patent Publication No. 2006-107692
[Patent Document 2] Japanese Laid-Open Patent Publication No. 2004-78172
[Patent Document 3] Japanese Laid-Open Patent Publication No. H8-87897
[Patent Document 4] International Publication Pamphlet No. 92/15992

SUMMARY OF THE INVENTION

Problems to be Solved by the Invention

Each stage of a shift register is provided with a transistor for lowering an output signal (hereinafter referred to as a lowering transistor). For example, in a unit circuit 91 illustrated in FIG. 17, a transistor TG3 functions as a lowering transistor. In order to cause a display device provided with a shift register including the unit circuits 91 to operate properly, it is necessary to lower a potential of a scanning signal line to a low level within a predetermined time period using the lowering transistor TG3.

However, amorphous silicon TFTs and microcrystalline silicon TFTs have a property that repeatedly applying a voltage to a gate terminal changes a threshold voltage (threshold voltage shift). Accordingly, in a shift register formed by amorphous silicon TFTs or microcrystalline silicon TFTs, a problem arises that a threshold voltage of a lowering transistor increases over time and falling time duration of an output signal becomes long. If the falling time duration exceeds a permissible time duration, the display device writes, after writing a gradation voltage to one pixel circuit, a gradation voltage to be written to the next pixel circuit to the same pixel circuit, and therefore the display device is not able to display a screen correctly. This problem is noticeable with display devices having a large-sized display panel.

Thus, an object of the present invention is to provide a shift register capable of reducing a threshold voltage shift of a transistor that resets an output signal, and of preventing reset time of the output signal from becoming long over time.

Means for Solving the Problems

According to a first aspect of the present invention, there is provided a shift register configured such that a plurality of unit circuits are cascade-connected and operating based on a plurality of clock signals, wherein each unit circuit includes: an output transistor having one conducting terminal supplied with one of the clock signals and the other conducting terminal connected to an output node; an input transistor configured to apply an ON potential to a control terminal of the output transistor according to a set signal that has been supplied; an output reset transistor configured to apply an OFF potential to the output node according to an output reset signal that has been supplied; an additional output transistor having a control terminal and one conducting terminal connected in an identical configuration with that of the output transistor, and having the other conducting terminal connected to an additional output node; and a compensation circuit configured to apply a compensation potential to the additional output node at predetermined timing, a polarity of the compensation potential being opposite to that of the ON potential taking the OFF potential as a reference, and the output reset transistor is supplied with a signal outputted from an additional output node included in a next stage unit circuit as the output reset signal.

According to a second aspect of the present invention, in the first aspect of the present invention, the compensation circuit includes: a first transistor configured to apply the ON potential to an internal node according to a signal outputted from the output node; a second transistor configured to apply the OFF potential to the internal node according to a compensation control signal that has been supplied; and a capacitor provided between the internal node and the additional output node.

According to a third aspect of the present invention, in the second aspect of the present invention, the compensation circuit further includes a third transistor having one conducting terminal supplied with the output reset signal and a control terminal connected to the internal node.

According to a fourth aspect of the present invention, in the second aspect of the present invention, the second transistor is supplied with a signal outputted from an additional output node included in a second next stage unit circuit as the compensation control signal.

According to a fifth aspect of the present invention, in the second aspect of the present invention, the capacitor is configured as a thin film transistor in which two conducting terminals are short-circuited to provide one electrode and a control terminal is provided as the other electrode.

According to a sixth aspect of the present invention, in the second aspect of the present invention, the signal outputted from the output node is supplied to a control terminal and one conducting terminal of the first transistor.

According to a seventh aspect of the present invention, in the second aspect of the present invention, the signal outputted from the output node is supplied to a control terminal of the first transistor, and the ON potential is fixedly applied to one conducting terminal of the first transistor.

According to an eighth aspect of the present invention, in the first aspect of the present invention, the compensation circuit applies the compensation potential to the additional output node every time when the ON potential is applied to the additional output node.

According to a ninth aspect of the present invention, in the first aspect of the present invention, each unit circuit further includes a state reset transistor configured to apply the OFF potential to the control terminal of the output transistor according to a state reset signal that has been supplied.

According to a tenth aspect of the present invention, in the first aspect of the present invention, each unit circuit further includes an output reset auxiliary transistor configured to apply the OFF potential to the output node according to a different one of the clock signals that has been supplied.

According to an eleventh aspect of the present invention, in the first aspect of the present invention, the set signal is supplied to a control terminal and one conducting terminal of the input transistor.

According to a twelfth aspect of the present invention, in the first aspect of the present invention, the set signal is supplied to a control terminal of the input transistor, and the ON potential is fixedly applied to one conducting terminal of the input transistor.

According to a thirteenth aspect of the present invention, in the first aspect of the present invention, the input transistor is supplied with a signal outputted from a previous stage unit circuit as the set signal.

According to a fourteenth aspect of the present invention, in the first aspect of the present invention, all of the transistors included in the unit circuits are of the same conductivity type.

According to a fifteenth aspect of the present invention, there is provided a display device including: a plurality of pixel circuits arranged two-dimensionally; and a drive circuit including the shift register according to one of the first to fourteenth aspects.

Effects of the Invention

According to the first aspect of the present invention, to the output reset transistor included in each stage unit circuit, the compensation potential outputted from the next stage unit circuit is supplied at predetermined timing. The compensation potential has a polarity opposite to the ON potential taking the OFF potential as a reference. Accordingly, even if the threshold voltage of the output reset transistor changes in a predetermined direction as being supplied with the ON potential, it is possible to change the threshold voltage of the output reset transistor in an opposite direction by supplying the compensation potential of a polarity opposite to the ON potential. Therefore, it is possible to reduce the threshold voltage shift of the output reset transistor, and to prevent the reset time of the output signal from becoming long over time. In addition, it is possible to reduce a layout area of the output reset transistor.

According to the second aspect of the present invention, by providing the capacitor between the additional output node and the internal node and selectively applying the ON potential and the OFF potential to the internal node, it is possible to apply the compensation potential of a polarity opposite to the ON potential taking the OFF potential as a reference to the additional output node.

According to the third aspect of the present invention, by providing the third transistor for the compensation circuit, it is possible to apply the ON potential to the internal node according to the output reset signal.

According to the fourth aspect of the present invention, by applying the OFF potential to the internal node according to the signal outputted from the additional output node included in the second next unit circuit, it is possible to apply the compensation potential to the additional output node when the output of the second next unit circuit changes.

According to the fifth aspect of the present invention, it is possible to reduce manufacturing cost of the shift register by configuring the capacitor by the thin film transistor.

According to the sixth aspect of the present invention, by supplying the control terminal and the one conducting terminal of the first transistor with the output signal of the unit circuit, it is possible to apply the ON potential to the internal node when the output signal of the unit circuit changes.

According to the seventh aspect of the present invention, by supplying the control terminal of the first transistor with the output signal of the unit circuit and applying the ON potential to the one conducting terminal of the first transistor, it is possible to apply the ON potential to the internal node when the output signal of the unit circuit changes.

According to the eighth aspect of the present invention, by alternately applying the ON potential and the compensation potential of a polarity opposite to the ON potential to the additional output node, it is possible to effectively reduce the threshold voltage shift of the output reset transistor.

According to the ninth aspect of the present invention, by providing the state reset transistor, the output transistor can be controlled to be in the OFF state.

According to the tenth aspect of the present invention, by providing the output reset auxiliary transistor, the output signal can be reset without fail according to the different clock signal.

According to the eleventh aspect of the present invention, by supplying the set signal to the control terminal and the one conducting terminal of the input transistor, it is possible to apply the ON potential to the control terminal of the output transistor using the input transistor.

According to the twelfth aspect of the present invention, by supplying the set signal to the control terminal of the input transistor and applying the ON potential to the one conducting terminal, it is possible to apply the ON potential to the control terminal of the output transistor using the input transistor.

According to the thirteenth aspect of the present invention, by supplying the signal outputted from the previous stage unit circuit to the input transistor, it is possible to configure a shift register that sequentially shifts the inputted signal.

According to the fourteenth aspect of the present invention, it is possible to reduce manufacturing cost of the shift register by using the transistors of the same conductivity type.

According to the fifteenth aspect of the present invention, it is possible to obtain a display device that can correctly display a screen using a shift register capable of reducing the threshold voltage shift of the output reset transistor and of preventing the reset time of the output signal from becoming long over time.

MODES FOR CARRYING OUT THE INVENTION

Figure 1:
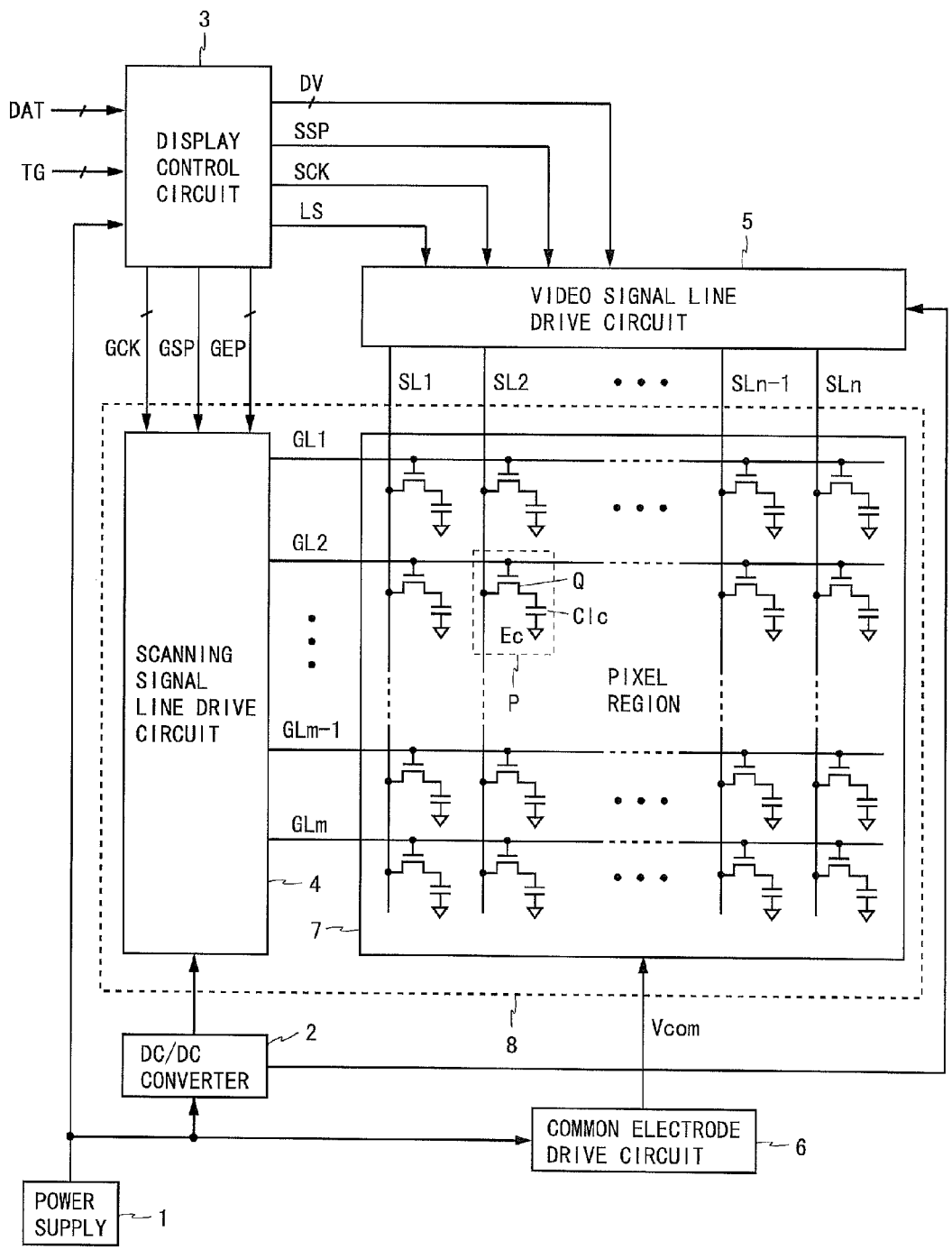
FIG. 1 is a block diagram illustrating a configuration of a liquid crystal display device according to embodiments of the present invention.

FIG. 1 is a block diagram illustrating a configuration of a liquid crystal display device according to the present invention. The liquid crystal display device illustrated in FIG. 1 is an active matrix-type display device provided with a power supply 1, a DC/DC converter 2, a display control circuit 3, a scanning signal line drive circuit 4, a video signal line drive circuit 5, a common electrode drive circuit 6, and a pixel region 7. The scanning signal line drive circuit 4 and the video signal line drive circuit 5 are also referred to as a gate driver circuit and a source driver circuit, respectively. In the following description, m and n are assumed to be integers not smaller than 2.

The pixel region 7 includes m scanning signal lines GL1 to GLm, n video signal lines SL1 to SLn, and (m×n) pixel circuits P. The scanning signal lines GL1 to GLm are arranged in parallel with each other, and the video signal lines SL1 to SLn are arranged in parallel with each other so as to orthogonally intersect with the scanning signal lines GL1 to GLm. The (m×n) pixel circuits P are arranged two-dimensionally so as to respectively correspond to intersections between the scanning signal lines GL1 to GLm and the video signal lines SL1 to SLn.

Each pixel circuit P includes a TFT Q and a liquid crystal capacitor Clc. A gate terminal of the TFT Q is connected to a corresponding one of the scanning signal lines, a source terminal of the TFT Q is connected to a corresponding one of the video signal lines, and a drain terminal of the TFT Q is connected to one electrode of the liquid crystal capacitor Clc. The other electrode of the liquid crystal capacitor Clc is a common electrode Ec that faces all of the pixel circuits P. Each pixel circuit P functions as a single pixel (or a single sub-pixel). It should be noted that each pixel circuit P may also include an auxiliary capacitor in parallel with the liquid crystal capacitor Clc.

The power supply 1 supplies a predetermined power supply voltage to the DC/DC converter 2, the display control circuit 3, and the common electrode drive circuit 6. The DC/DC converter 2 generates a predetermined direct voltage based on the power supply voltage supplied from the power supply 1, and supplies the generated voltage to the scanning signal line drive circuit 4 and the video signal line drive circuit 5. The common electrode drive circuit 6 applies a predetermined potential Vcom to the common electrode Ec.

The display control circuit 3 outputs a digital video signal DV and a plurality of control signals based on an image signal DAT and a group of timing signals TG that are externally supplied. The group of timing signals TG includes a horizontal synchronizing signal, a vertical synchronizing signal and the like. The control signals outputted from the display control circuit 3 include a source start pulse signal SSP, a source clock signal SCK, a latch strobe signal LS, a gate clock signal GCK, a gate start pulse signal GSP, and a gate end pulse signal GEP. The gate clock signal GCK includes four signals, the gate start pulse signal GSP includes one or two signals, and the gate end pulse signal GEP includes two or four signals (details will be described later).

The scanning signal line drive circuit 4 selects one of the scanning signal lines GL1 to GLm sequentially based on the gate clock signal GCK, the gate start pulse signal GSP, and the gate end pulse signal GEP outputted from the display control circuit 3, and applies a potential for turning the TFT Q to an ON state (high level potential) to the selected scanning signal line. With this, n pixel circuits P connected to the selected scanning signal line are selected collectively.

The video signal line drive circuit 5 applies n gradation voltages respectively to the video signal lines SL1 to SLn according to the digital video signal DV, based on the digital video signal DV, the source start pulse signal SSP, the source clock signal SCK, and the latch strobe signal LS outputted from the display control circuit 3. With this, the n gradation voltages are written respectively to the n pixel circuits P selected using the scanning signal line drive circuit 4. By writing gradation voltages to all of the pixel circuits P within the pixel region 7 using the scanning signal line drive circuit 4 and the video signal line drive circuit 5, it is possible to display an image based on the image signal DAT in the pixel region 7.

The scanning signal line drive circuit 4 is monolithically formed on a liquid crystal panel 8 having the pixel region 7 formed thereon. TFTs included in the scanning signal line drive circuit 4 are formed using amorphous silicon, microcrystalline silicon, or oxide semiconductor, for example. It should be noted that all or a part of other circuits included in the liquid crystal display device may be monolithically formed on the liquid crystal panel 8.

The scanning signal line drive circuit 4 includes a shift register configured such that a plurality of unit circuits are cascade-connected and that operates based on a plurality of clock signals. The liquid crystal display device according to the embodiments of the present invention has a characteristic in a circuit configuration of the shift register included in the scanning signal line drive circuit 4. Hereinafter, the shift register included in the scanning signal line drive circuit 4 will be described.

First Embodiment

Figure 2:
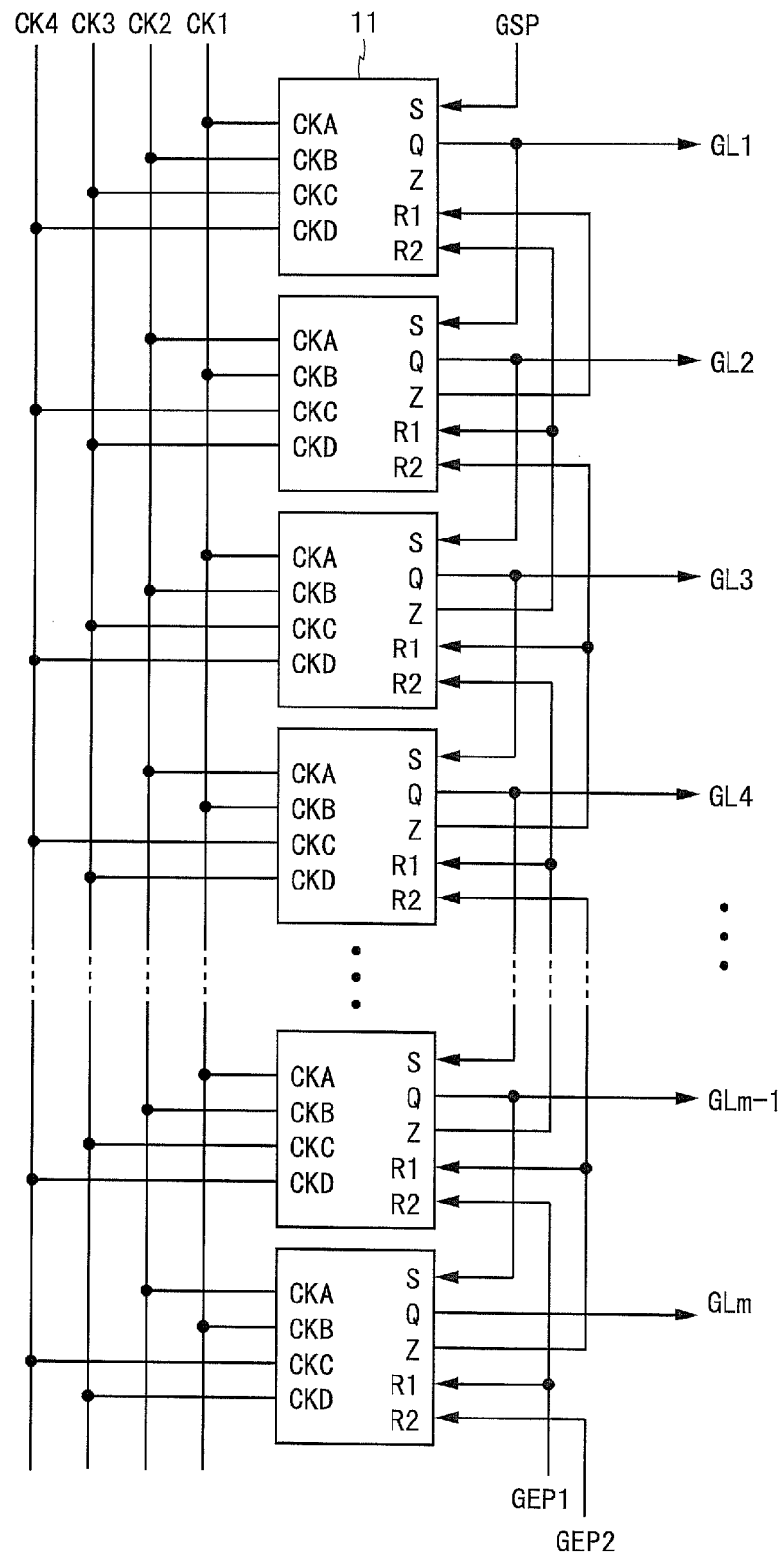
FIG. 2 is a block diagram illustrating a configuration of a shift register according to a first embodiment of the present invention.

FIG. 2 is a block diagram illustrating a configuration of a shift register according to a first embodiment of the present invention. The shift register illustrated in FIG. 2 includes m unit circuits 11 arranged one-dimensionally. In the following description, a unit circuit 11 in an i-th position (i is an integer not smaller than 1 and not greater than m) is referred to as an i-th unit circuit UC(i). In this embodiment, m is assumed to be a multiple of 2.

The shift register illustrated in FIG. 2 is supplied with four clock signals CK1 to CK4 as the gate clock signal GCK, a single signal as the gate start pulse signal GSP, and a first gate end pulse signal GEP1 and a second gate end pulse signal GEP2 as the gate end pulse signal GEP.

Each unit circuit 11 is supplied with the four clock signals CKA, CKB, CKC, and CKD, a set signal S, a first reset signal R1, a second reset signal R2, and a low level potential VSS (not depicted). Each unit circuit 11 outputs an output signal Q and an additional output signal Z.

When k is assumed to be an integer not smaller than 1 and not greater than (m/2), the clock signals CK1, CK2, CK3, and CK4 are inputted to an odd-numbered unit circuit UC(2k−1) respectively as the clock signals CKA, CKB, CKC, and CKD. To an even-numbered unit circuit UC(2k), the clock signals CK2, CK1, CK4, and CK3 are inputted respectively as the clock signals CKA, CKB, CKC, and CKD.

To a first unit circuit UC(1), the gate start pulse signal GSP is inputted as the set signal S. To a unit circuit UC(i) that is not the first unit circuit, the output signal Q outputted from a previous unit circuit UC(i−1) is inputted as the set signal S. To an (m−1)-th unit circuit UC (m−1), the first gate end pulse signal GEP1 is inputted as the second reset signal R2. To an m-th unit circuit UC(m), the first gate end pulse signal GEP1 is inputted as the first reset signal R1, and the second gate end pulse signal GEP2 is inputted as the second reset signal R2. To a unit circuit UC(i) that is not the m-th unit circuit UC(m), the additional output signal Z outputted from a next unit circuit UC (i+1) is inputted as the first reset signal R1. To a unit circuit UC(i) that is not the (m−1)-th nor the m-th unit circuit, the additional output signal Z outputted from a second next unit circuit UC(i+2) is inputted as the second reset signal R2. The i-th scanning signal line GLi is driven based on the output signal Q outputted from the i-th unit circuit UC(i).

As described above, in the shift register illustrated in FIG. 2, the unit circuit of each stage is supplied with the output signal Q outputted from a previous stage unit circuit as the set signal S, the additional output signal Z outputted from a next stage unit circuit as the first reset signal R1, and the additional output signal Z outputted from a second next stage unit circuit as the second reset signal R2.

Figure 3:
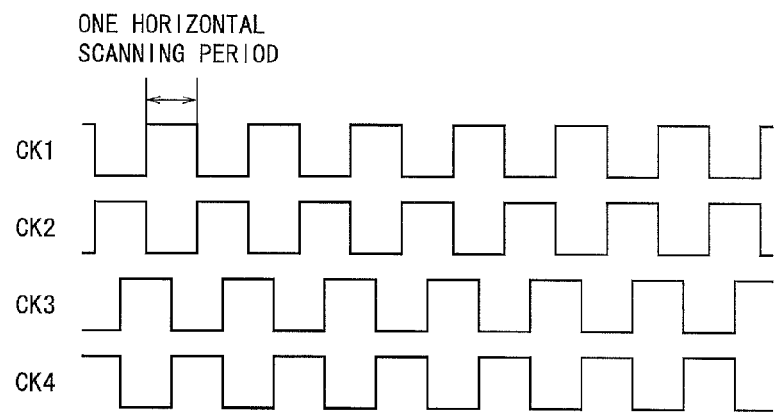
FIG. 3 is a timing chart of clock signals supplied to the shift register illustrated in FIG. 2.

FIG. 3 is a timing chart of the clock signals CK1 to CK4. As illustrated in FIG. 3, each of the clock signals CK1 to CK4 becomes a high level every other one horizontal scanning period. Phases of the clock signals CK1 and CK2 are displaced from each other by 180 degrees (corresponding to one horizontal scanning period), and phases of the clock signals CK3 and CK4 are also displaced from each other by 180 degrees. The phase of the clock signal CK3 is ahead of the phase of the clock signal CK1 by 90 degrees. The phase of the clock signal CK4 is ahead of the phase of the clock signal CK2 by 90 degrees.

Figure 4:
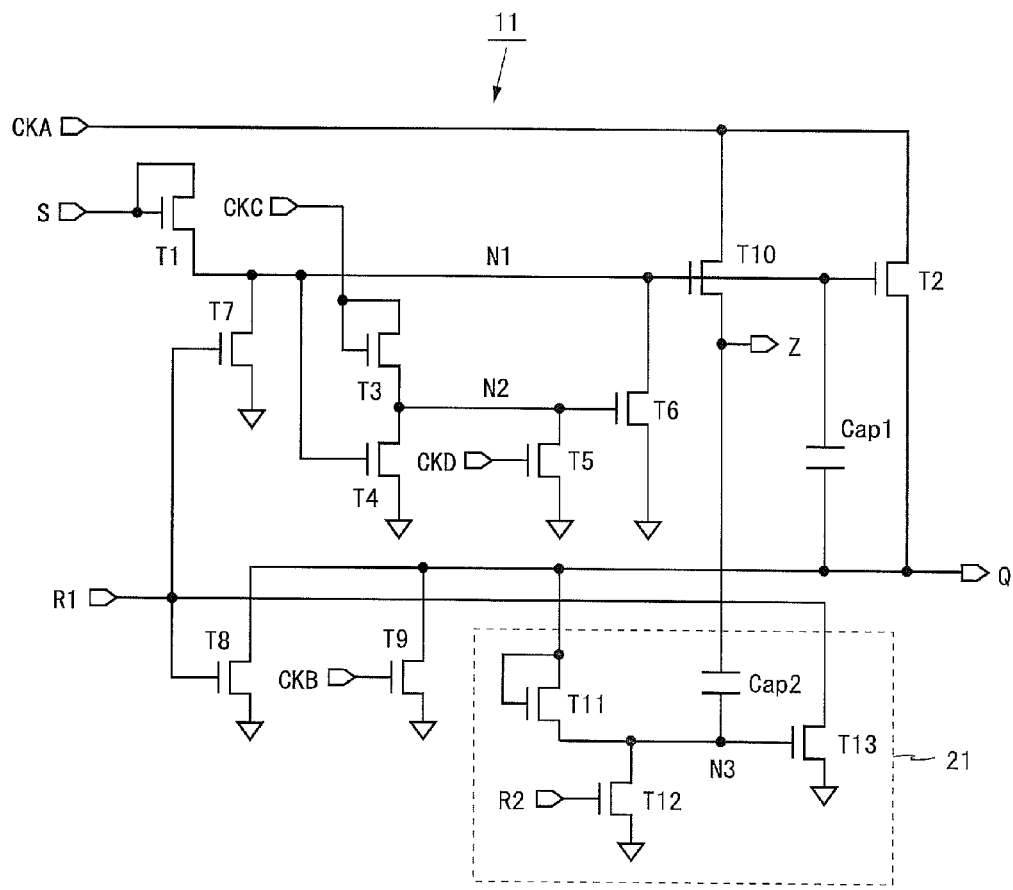
FIG. 4 is a circuit diagram of a unit circuit included in the shift register illustrated in FIG. 2.

FIG. 4 is a circuit diagram of the unit circuit 11. As illustrated in FIG. 4, each unit circuit 11 includes 13 N-channel type TFTs T1 to T13, and two capacitors Cap1 and Cap2. Among these, the TFTs T11 to T13 and the capacitor Cap2 constitute a compensation circuit 21. For the N-channel type TFTs, a high level potential is an ON potential and a low level potential is an OFF potential.

A source terminal of the TFT T1, drain terminals of the TFTs T6 and T7, gate terminals of the TFTs T2, T4, and T10, and one end of the capacitor Cap1 are connected to a node N1. A source terminal of the TFT T3, drain terminals of the TFTs T4 and T5, and a gate terminal of the TFT T6 are connected to a node N2. A source terminal of the TFT T11, a drain terminal of the TFT T12, a gate terminal of the TFT T13, and one end of the capacitor Cap2 are connected to a node N3. A source terminal of the TFT T2, drain terminals of the TFTs T8 and T9, a drain terminal and a gate terminal of the TFT T11, and the other end of the capacitor Cap1 are connected to an output terminal Q. A source terminal of the TFT T10 and the other end of the capacitor Cap2 are connected to an additional output terminal Z.

To a gate terminal and a drain terminal of the TFT T1, the set signal S is supplied. To drain terminals of the TFTs T2 and T10, the clock signal CKA is supplied. To a gate terminal and a drain terminal of the TFT T3, the clock signal CKC is supplied. The clock signal CKD is supplied to a gate terminal of the TFT T5, and the clock signal CKB is supplied to a gate terminal of the TFT T9. To gate terminals of the TFTs T7 and T8, and a drain terminal of the TFT T13, the first reset signal R1 is supplied. To a gate terminal of the TFT T12, the second reset signal R2 is supplied. To source terminals of the TFTs T4 to T9, T12, and T13, the low level potential VSS is fixedly applied.

The TFT T1 keeps a potential of the node N1 at a high level while the set signal S is at a high level. The set signal S is the output signal Q outputted from the previous stage unit circuit 11. Therefore, when the output from the previous stage unit circuit 11 becomes a high level, the potential of the node N1 rises up to a high level. The TFT T2 outputs the clock signal CKA as the output signal Q while the potential of the node N1 is at a high level.

The TFT T3 keeps a potential of the node N2 at a high level while the clock signal CKC is at a high level. The TFT T4 keeps the potential of the node N2 at a low level while the potential of the node N1 is at a high level. If the potential of the node N2 becomes a high level erroneously during a selection period of a corresponding one of the scanning signal lines, the TFT T6 is turned to an ON state, the potential of the node N1 falls, and the TFT T2 is turned to an OFF state. The TFT T4 is provided in order to prevent such a phenomenon from occurring.

The TFT T5 keeps the potential of the node N2 at a low level while the clock signal CKD is at a high level. In a case in which the TFT T5 is not provided, the potential of the node N2 is always at a high level other than the selection period of the corresponding one of the scanning signal lines, and bias voltages are kept being applied to the TFTs T6 and T10. If this situation continues, threshold voltages of the TFTs T6 and T10 rise, and neither the TFTs T6 nor T10 functions correctly as a switch. The TFT T5 is provided in order to prevent such a phenomenon from occurring.

The TFT T6 keeps the potential of the node N1 at a low level while the potential of the node N2 is at a high level. The TFT T7 keeps the potential of the node N1 at a low level while the first reset signal R1 is at a high level. The TFT T8 applies a low level potential to the output terminal Q while the first reset signal R1 is at a high level. The first reset signal R1 is the additional output signal Z outputted from the next stage unit circuit 11. Therefore, when the output from the next stage unit circuit 11 becomes a high level, the potential of the node N1 falls down to a low level, and the output signal Q becomes a low level.

The TFT T9 applies a low level potential to the output terminal Q while the clock signal CKB is at a high level. The TFT T10 outputs the clock signal CKA as the additional output signal Z while the potential of the node N1 is at a high level. The capacitor Cap1 is a compensation capacitor that keeps the potential of the node N1 at a high level.

The TFT T11 keeps a potential of the node N3 at a high level while the output signal Q at a high level. Therefore, when the output from the current stage unit circuit 11 becomes a high level, the potential of the node N3 rises up to a high level. The TFT T12 keeps the potential of the node N3 at a low level while the second reset signal R2 is at a high level. The second reset signal R2 is the additional output signal Z outputted from the second next stage unit circuit 11. Therefore, when the output from the second next stage unit circuit 11 becomes a high level, the potential of the node N3 falls down to a low level. The TFT T13 keeps the potential of the node N3 at a high level while the first reset signal R1 is at a high level. The capacitor Cap2 is provided between the additional output terminal Z and the node N3, and lowers a potential of the additional output signal Z when the potential of the node N3 falls.

Figure 5:
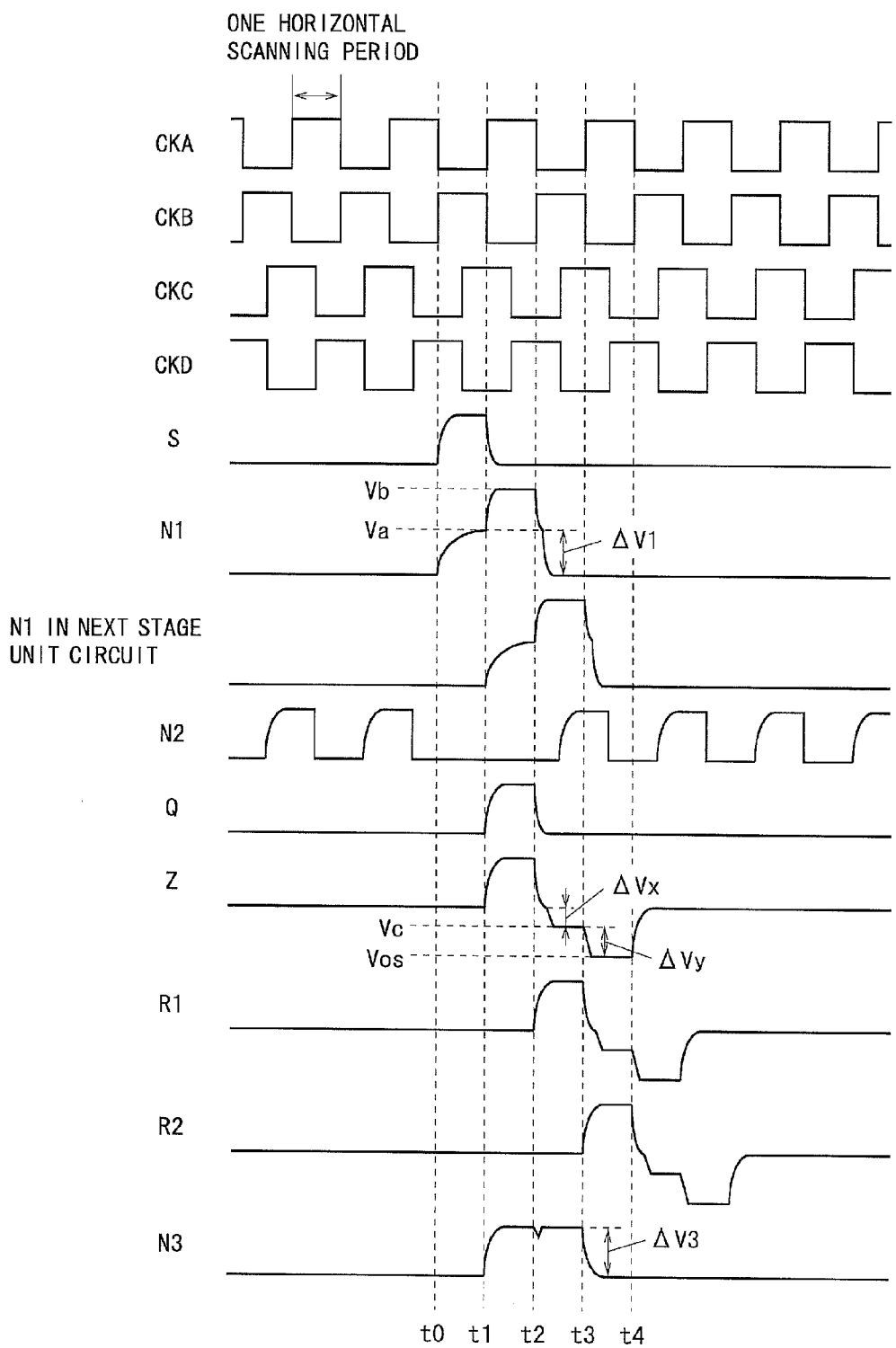
FIG. 5 is a timing chart of the shift register illustrated in FIG. 2.

FIG. 5 is a timing chart of the shift register according to this embodiment. The clock signals CKA, CKB, CKC, and CKD inputted to the unit circuit 11 change as shown in FIG. 5. In an initial state, the potentials of the nodes N1 and N3 are both at a low level.

At time t0, the set signal S (an output from the previous stage unit circuit) changes from a low level to a high level. As the TFT T1 is diode-connected, when the set signal S becomes a high level, the potential of the node N1 becomes a high level (hereinafter, the potential of the node N1 at this time is referred to as Va). Accordingly, the TFT T2 is turned to the ON state. Further, as the TFT T4 is also turned to the ON state, the potential of the node N2 becomes a low level, and the TFT T6 is turned to the OFF state. The potential of the node N1 is maintained at or over Va until time t2 that will be described later.

At time t1, the clock signal CKA changes from a low level to a high level. The clock signal CKA is supplied to the drain terminal of the TFT T2, and the capacitor Cap1 is present between the gate and the source of the TFT T2. Further, the TFT T2 is in the ON state at this time, and the node N1 is in a floating state. Accordingly, when a potential at the drain terminal of the TFT T2 rises, the potential of the node N1 also rises (bootstrap effect). As a result, the potential of the node N1 becomes higher than the potential Va (hereinafter, the potential of the node N1 at this time is referred to as Vb). The potential Vb is higher than the high level potential of the clock signal CKA. As the clock signal CKA becomes a high level in a time period from time t1 to time t2, the potential of the node N1 becomes Vb substantially in the same time period, and the output signal Q becomes a high level substantially in the same time period. At this time, the scanning signal line to which the output signal Q is applied is in the selected state, and writing of the video signal is performed to the plurality of pixel circuits P connected to this scanning signal line.

Further, at time t1, the TFT T10 is also turned to the ON state. Therefore, similarly to the output signal Q, the additional output signal Z becomes a high level from time t1 to time t2. Further, as the TFT T11 is diode-connected, when the output signal Q becomes high level, the potential of the node N3 also becomes a high level.

At time t2, the clock signal CKA changes from a high level to a low level, and the clock signal CKB and the first reset signal R1 (outputs from the next stage unit circuit) change from a low level to a high level. At this time, the TFTs T7 to T9 are turned to the ON state. When the TFT T7 is turned to the ON state, the potential of the node N1 changes to a low level, and the TFTs T2 and T10 are turned to the OFF state. When the TFTs T8 and T9 are turned to the ON state, the output signal Q becomes a low level.

At this time, the clock signal CKA changes to a low level before the TFT T10 is turned to the OFF state. Accordingly, the potential of the additional output terminal Z becomes a low level immediately after time t2. Further, when the TFT T10 is turned to the OFF state, the additional output terminal Z is brought into the floating state. As a parasitic capacitance (not depicted) is present between the gate and the source of the TFT T10, when the potential of the node N1 changes from a high level to a low level, the potential of the additional output terminal Z connected to the source terminal of the TFT T10 becomes lower than a low level (hereinafter, the potential of the additional output terminal Z at this time is referred to as Vc).

Further, when the output signal Q becomes a low level, the TFT T11 is turned to the OFF state, and the node N3 is brought into the floating state. At this time, as a current flows from the node N3 to the output terminal Q before the TFT T11 is turned completely to the OFF state, the potential of the node N3 falls from a high level.

The first reset signal R1 is also supplied to the drain terminal of the TFT T13, and a capacitance (not depicted) is present between the drain and the gate of the TFT T13. Accordingly, when the first reset signal R1 becomes a high level, the potential of the node N3 connected to the gate terminal of TFT T13 is raised to a high level. Therefore, the potential of the node N3 falls from a high level immediately after time t2, and then returns to a high level.

At time t3, the first reset signal R1 changes from a high level to a low level, and the second reset signal R2 (an output from the second next stage unit circuit) changes from a low level to a high level. At this time, the TFTs T7 to T9 are turned to the OFF state, and the TFT T12 is turned to the ON state. When the TFT T12 is turned to the ON state, the potential of the node N3 changes to a low level. At this time, as the additional output terminal Z is in the floating state, when the potential of the node N3 changes from a high level to a low level, the potential of the additional output terminal Z becomes further lower than the potential Vc (hereinafter, the potential of the node N3 at this time is referred to as an overshoot potential Vos).

At time t4, the second reset signal R2 changes from a high level to a low level. At this time, the TFT T12 is turned to the OFF state, and the node N3 is brought into the floating state. At this time point, the potentials of the nodes N1 and N3 are both at a low level. Therefore, the potential of the additional output terminal Z is drawn to the potentials of the nodes N1 and N3 and set back to a low level.

Parasitic capacitances of the node N1, the node N3, and the additional output terminal Z are respectively represented by Cn1, Cn3, and Cz. Further, an amount of potential change when the potential of the node N1 changes from Va to a low level is represented by $\Delta V1$, an amount of potential change of the additional output terminal Z at this time is represented by $\Delta Vx$, an amount of potential change when the potential of the node N3 changes from a high level to a low level is represented by $\Delta V3$, and an amount of potential change of the additional output terminal Z at this time is represented by $\Delta Vy$. From the principle of conservation of charge, the amounts of potential change ΔVx and ΔVy are approximately given based on equations (1) and (2) shown below. Further, where the low level potential (logical low potential) is Vgl, the overshoot potential Vos is given based on an equation (3) shown below.

$$\Delta Vx = \Delta V1 \times (Cn1/Cz) \quad (1)$$

$$\Delta Vy = \Delta V3 \times (Cn3/Cz) \quad (2)$$

$$Vos = Vgl - \Delta Vx - \Delta Vy$$

The overshoot potential Vos is lower than the low level potential Vgl, and determined based on the parasitic capacitance Cn1, Cn3, and Cz of the nodes N1 and N3 and the additional output terminal Z, as well as on the amounts of potential change ΔV1 and ΔV3 of the nodes N1 and N3. The high level potential is higher than the low level potential, and the overshoot potential Vos is lower than the low level potential. Such an overshoot potential Vos constitutes a compensation potential of a polarity opposite to that of the high level potential taking the low level potential as a reference. The compensation circuit 21 applies a compensation potential of a polarity opposite to the ON potential taking the OFF potential as a reference, to the additional output terminal Z at predetermined timing.

Figure 6:
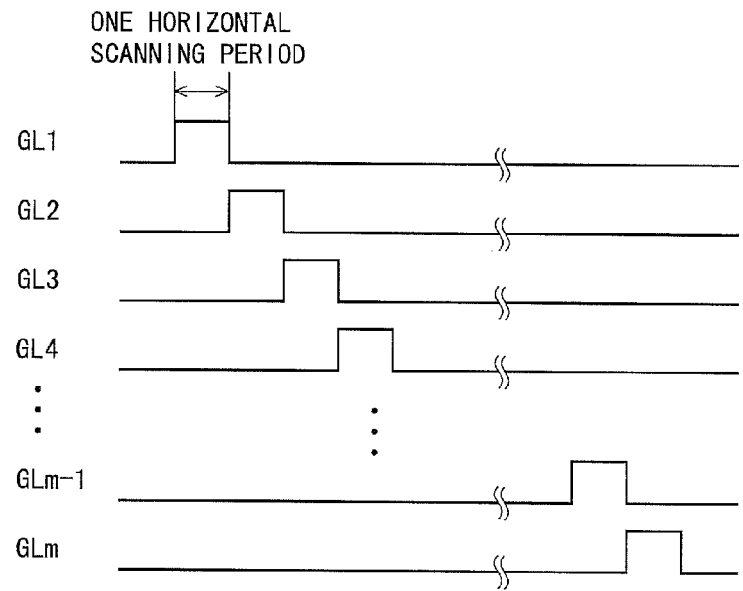
FIG. 6 is a timing chart of signals outputted from the shift register illustrated in FIG. 2.

The clock signals of four phases illustrated in FIG. 3 are applied to the shift register illustrated in FIG. 2, and the gate start pulse signal GSP, the first gate end pulse signal GEP1, and the second gate end pulse signal GEP2 are controlled to be a high level for one horizontal scanning period at predetermined timing. With this, a pulse applied to a unit circuit of a first stage (first unit circuit UC(1)) is sequentially transferred to a unit circuit of a last stage (m-th unit circuit UC(m)). At this time, the potentials of the scanning signal lines GL1 to GLm are changed to a high level sequentially for one horizontal scanning period (see FIG. 6).

Further, as illustrated in FIG. 5, the potential of the additional output signal Z becomes a high level when the output signal Q is at a high level, then becomes lower than the low level (the potential Vc), and then becomes further lower than the potential Vc (the overshoot potential Vos). The additional output signal Z is supplied, as the first reset signal R1, to the gate terminal of the TFT T8 included in the previous stage unit circuit 11, for example. In other words, to the gate terminal of the TFT T8, the additional output signal Z outputted from the next stage unit circuit 11 is applied.

Next, an effect of the shift register according to this embodiment will be described. Here, a unit circuit obtained by removing the compensation circuit 21 from the unit circuit 11 is referred to as a conventional unit circuit, and a shift register in which the conventional unit circuits are cascade-connected is referred to as a conventional shift register. In the conventional shift register, similarly to the shift register according to this embodiment, the additional output signal Z outputted from a next stage unit circuit is applied to the gate terminal of the TFT T8.

According to the conventional shift register, the additional output signal Z changes in the same manner as the output signal Q. More specifically, the additional output signal Z is normally at a low level and becomes a high level once in one frame period. Accordingly, in the conventional shift register, a stress voltage of a positive polarity is repeatedly applied to the TFT T8. However, amorphous silicon TFTs and microcrystalline silicon TFTs have a property that repeatedly applying a voltage to a gate terminal changes a threshold voltage. Accordingly, in a case in which the TFT T8 is formed using amorphous silicon or microcrystalline silicon, a problem arises that a threshold voltage of the TFT T8 increases over time and a falling time duration of the output signal Q becomes long.

Figure 7:
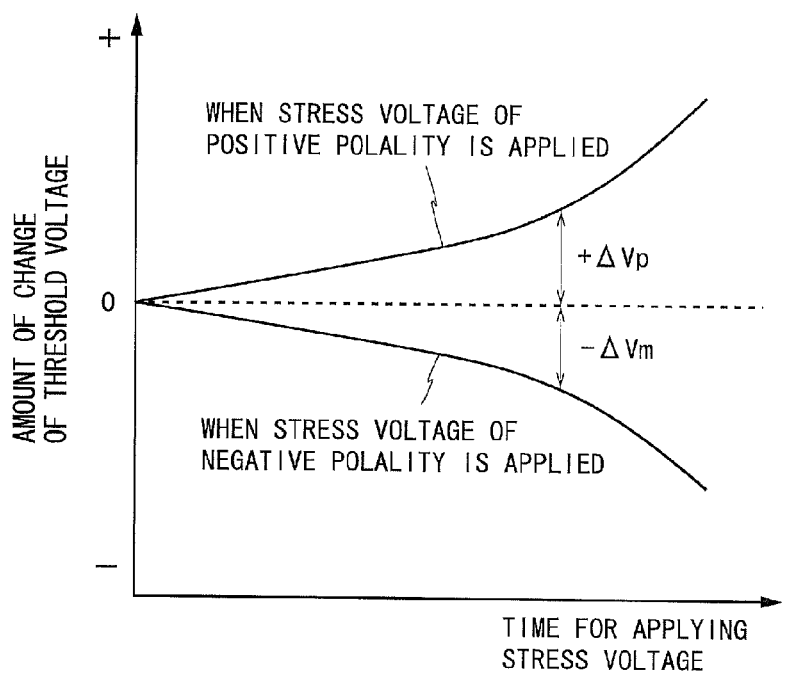
FIG. 7 is a chart showing a change in a threshold voltage of an amorphous silicon TFT.

Thus, the shift register according to this embodiment utilizes the property that the threshold voltage of a TFT changes in a direction according to the polarity of the stress voltage. FIG. 7 is a chart showing a change in a threshold voltage of an amorphous silicon TFT. In FIG. 7, a horizontal axis indicates time for applying the stress voltage, and a vertical axis indicates an amount of change of the threshold voltage. As shown in FIG. 7, the threshold voltage of the amorphous silicon TFT increases when a stress voltage of a positive polarity is applied, and decreases when a stress voltage of a negative polarity is applied. Where an amount of increase of the threshold voltage when a stress voltage of a positive polarity is applied is represented by +ΔVp and an amount of decrease of the threshold voltage when a stress voltage of a negative polarity is applied is represented by −ΔVm, and where absolute values and the time for application are set to be the same between the two types of the stress voltages, a ratio of the amount of increase and the amount of decrease of the threshold voltage (ΔVm/ΔVp) is on the order of 0.5 to 1.0, for example.

The unit circuit 11 of the shift register according to this embodiment includes the compensation circuit 21 configured to apply the overshoot potential Vos as a compensation potential to the additional output terminal Z at predetermined timing. Accordingly, the potential of the additional output signal Z first becomes a high level, and then becomes the overshoot potential Vos that is lower than the low level. Therefore, to the gate terminal of the TFT T8, the high level potential and the overshoot potential Vos of a polarity opposite to the high level potential are alternately applied.

Therefore, even if the threshold voltage of the TFT T8 becomes high due to applying the high level potential to the gate terminal of the TFT T8, it is possible to change the threshold voltage of the TFT T8 to be low and prevent the threshold voltage of the TFT T8 from increasing by applying the overshoot potential Vos of a polarity opposite to the high level potential to the gate terminal of the TFT T8. For example, it is assumed that in the conventional shift register, the threshold voltage of the TFT T8 increases by 1.0 V at the time when predetermined time T has elapsed. Further, it is assumed that the ratio (ΔVm/ΔVp) is 0.5. In this case, in the shift register according to this embodiment, at the time when the time T has elapsed, the threshold voltage of the TFT T8 is increased by 1.0 V and decreased by 0.5 V, and therefore is increased only by 0.5 V as a result.

Thus, according to the shift register of this embodiment, it is possible to reduce the threshold voltage shift of the TFT T8, and to prevent the falling time duration of the output signal Q from becoming long over time. Further, it is possible to reduce a channel width of the TFT T8 to reduce a layout area of the TFT T8. Moreover, as the overshoot potential Vos can be generated within the unit circuit 11, it is not necessary to provide an additional power supply circuit outside the shift register.

Next, an effect of preventing the delay of the falling time duration of the output signal Q will be described. When the TFT T8 operates in a linear region, a current I flowing through the TFT T8 when the output signal Q falls is given based on an equation (4) below.

$$I = (W/L) \cdot \mu \cdot Cox \cdot \{(Vg - Vt)Vd - (1/2)Vd^2\} \quad (4)$$

Here, W is a gate width, L is a gate length, μ is a carrier mobility, Cox is a gate oxide capacitance, Vg is a gate applied voltage, Vd is a drain applied voltage, and Vt is a threshold voltage.

For example, suppose that W=5000, L=5, μ=0.3, Cox=2×$10^{-8}$, and Vg=Vd=30 (however, the unit of the numeric values are an arbitrary unit (a.u.), and the same applies hereinafter), and Vt=2 in an initial state. In this case, a current Ia flowing through the TFT T8 in the initial state is Ia=2.34×$10^{-3}$ from the equation (4).

According to the conventional shift register, the threshold voltage of the TFT T8 is assumed to increase up to Vt=10 at the time when predetermined time T has elapsed. In this case, a current Ib flowing through the TFT T8 at the time when the time T has elapsed is expressed as Ib=0.90×$10^{-3}$ from the equation (4). As described above, according to the conventional shift register, the current flowing through the TFT T8 at the time when the time T has elapsed is reduced by about 61% from the initial state.

It is assumed that in the shift register according to this embodiment, an amount of increase of the threshold voltage is 50% of the conventional shift register. In this case, the threshold voltage of the TFT T8 increases up to Vt=6 at the time when the time T has elapsed. Accordingly, a current Ic flowing through the TFT T8 at the time when the time T has elapsed is expressed as Ic=1.62×$10^{-3}$ from the equation (4). As described above, according to the shift register of this embodiment, the current flowing through the TFT T8 at the time when the time T has elapsed is reduced by only about 31% from the initial state. At the time point when the time T has elapsed, the falling time duration of the output signal Q of the shift register according to this embodiment is about 56% (=0.90/1.62) of the conventional shift register.

Figure 8:
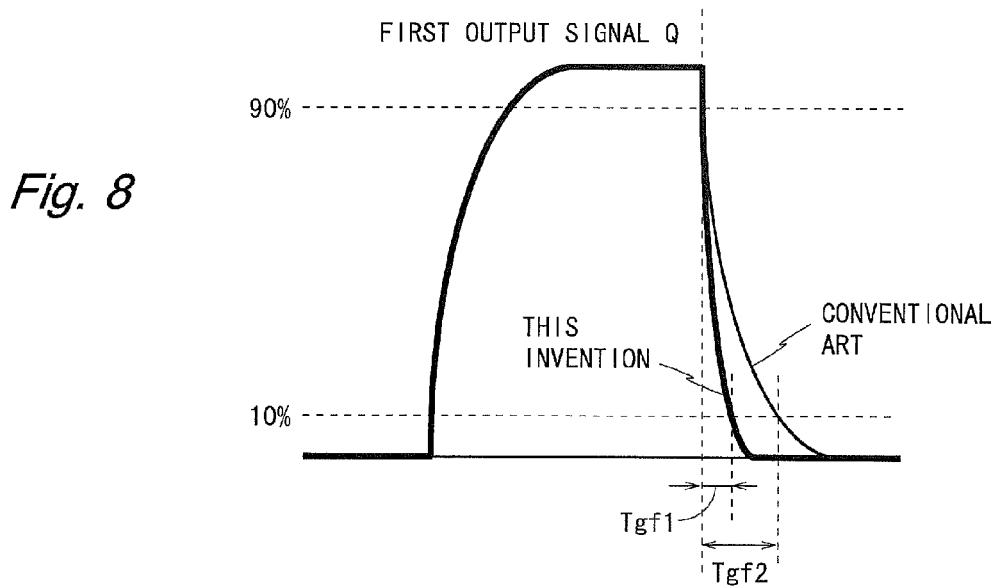
FIG. 8 is a signal waveform diagram of a signal outputted from the shift register illustrated in FIG. 2.

FIG. 8 is a signal waveform diagram of the output signal Q. In FIG. 8, Tgf1 represents the falling time duration from 90% to 10% of the output signal Q in the shift register according to this embodiment, and Tgf2 represents the same falling time duration in the conventional shift register. In the above example, the falling time duration Tgf1 according to this embodiment is about 56% of the falling time duration Tgf2 in the conventional example.

Next, an effect of reducing the layout area of the TFT T8 is described. If it is not necessary to decrease the falling time duration of the output signal Q even if the threshold voltage shift occurs in the TFT T8, it is possible to decrease the gate width of the TFT T8 by an amount by which the threshold voltage shift of the TFT T8 is reduced by providing the compensation circuit 21, thereby reducing the layout area of the TFT T8.

For example, it is assumed that in the conventional shift register, the gate width of TFT T8 becomes 5000 as a result of designing a circuit such that the current flowing through the TFT T8 at the time when the predetermined time T has elapsed is expressed by Ib=0.90×$10^{-3}$. In the shift register according to this embodiment, when the gate width of the TFT T8 becomes 5000, the current flowing through the TFT T8 at the time when the time T has elapsed is expressed by Ic=1.62×$10^{-3}$. As 0.90×$10^{-3}$ is sufficient for the current flowing through the TFT T8, the gate width of the TFT T8 can be reduced to 2800 (=5000×0.90/1.62). Therefore, the layout area of the TFT T8 of the shift register according to this embodiment becomes about 56% (=2800/5000) of the conventional shift register.

As described above, the shift register according to this embodiment is configured such that the plurality of the unit circuits 11 are cascade-connected and that operates based on the plurality of clock signals CK1 to CK4. Each unit circuit 11 includes an output transistor (TFT T2) having one conducting terminal (drain terminal) supplied with a single clock signal (the clock signal CK1 or CK2) and the other conducting terminal (source terminal) connected to the output terminal Q, an input transistor (TFT T1) that applies an ON potential (high level potential) to a control terminal of the output transistor according to the supplied set signal S, an output reset transistor (TFT T8) that applies an OFF potential (low level potential) to the output terminal Q according to the supplied first reset signal R1, an additional output transistor (TFT T10) having the control terminal and the one conducting terminal (the gate terminal and the drain terminal) connected in the same manner as the output transistor and the other conducting terminal (source terminal) connected to the additional output terminal Z, and the compensation circuit 21 that applies a compensation potential (the overshoot potential Vos) of a polarity opposite to the ON potential taking the OFF potential as a reference, to the additional output terminal Z at predetermined timing. To the output reset transistor, the additional output signal Z outputted from the next stage unit circuit 11 is supplied as the first reset signal R1.

Accordingly, to the output reset transistor included in each stage unit circuit 11, the compensation potential outputted from the next stage unit circuit 11 and of a polarity opposite to the ON potential taking the OFF potential as a reference is supplied at predetermined timing. Therefore, even if the threshold voltage of the output reset transistor changes in a predetermined direction (changes to increase) as being supplied with the ON potential, it is possible to change the threshold voltage of the output reset transistor in an opposite direction (change to decrease) by supplying the compensation potential of a polarity opposite to the ON potential. Thus, it is possible to reduce the threshold voltage shift of the output reset transistor, and to prevent the reset time of the output signal from becoming long over time. In addition, it is possible to reduce a layout area of the output reset transistor.

Further, the compensation circuit 21 includes a first transistor (TFT T11) that applies an ON potential to the node N3 according to the output signal Q, a second transistor (TFT T12) that applies an OFF potential to the node N3 according to the second reset signal R2, and the capacitor Cap2 provided between the node N3 and the additional output terminal Z. In this manner, by providing the capacitor Cap2 between the additional output terminal Z and the node N3 and selectively applying the ON potential and the OFF potential to the node N3, it is possible to apply the compensation potential of a polarity opposite to the ON potential taking the OFF potential as a reference to the additional output terminal Z.

Moreover, the compensation circuit 21 further includes a third transistor (TFT T13) having one conducting terminal (drain terminal) supplied with the first reset signal R1, and the control terminal (gate terminal) connected to the node N3. By providing such a third transistor, it is possible to apply the ON potential to the node N3 according to the first reset signal R1. In addition, to the second transistor, the additional output signal Z outputted from the second next stage unit circuit is supplied as the second reset signal R2. With this, the OFF potential is applied to the node N3 according to the additional output signal outputted from the second next stage unit circuit, and it is possible to apply the compensation potential to the additional output terminal Z when the output of the second next stage unit circuit changes.

Furthermore, the output signal Q is supplied to the control terminal and the one conducting terminal of the first transistor (the drain terminal and the gate terminal of the TFT T11). With this, it is possible to apply the ON potential to the node N3 when the output signal Q changes. In addition, the compensation circuit 21 applies the compensation potential to the additional output terminal Z every time when the ON potential is applied to the additional output terminal Z. In this manner, by alternately applying the ON potential and the compensation potential of a polarity opposite to the ON potential to the additional output terminal Z, it is possible to effectively reduce the threshold voltage shift of the output reset transistor.

Each unit circuit 11 further includes a state reset transistor (TFT T7) that applies an OFF potential to the control terminal of the output transistor according to the supplied first reset signal R1. By providing such a state reset transistor, the output transistor can be controlled to be in the OFF state. Moreover, each unit circuit 11 also includes an output reset auxiliary transistor (TFT T9) that applies an OFF potential to the output terminal Q according to a different clock signal that is supplied (the clock signal CK1 or CK2). By providing such an output reset auxiliary transistor, the output signal can be reset without fail according to the different clock signal.

Furthermore, the set signal S is supplied to the control terminal and the one conducting terminal of the input transistor (the gate terminal and the drain terminal of the TFT T1). With this, it is possible to apply an ON potential to the control terminal of the output transistor using the input transistor. In addition, to the input transistor, a signal outputted from the previous stage unit circuit 11 is supplied as the set signal S. With this, it is possible to constitute a shift register that sequentially shifts the inputted signal.

Moreover, all the transistors included in the unit circuit 11 are of the same conductivity type (N-channel type). It is possible to reduce manufacturing cost of the shift register by using the transistors of the same conductivity type. Further, according to the liquid crystal display device provided with the scanning signal line drive circuit 4 including the shift register according to this embodiment, it is possible to obtain a liquid crystal display device that can correctly display a screen using a shift register capable of reducing the threshold voltage shift of the output reset transistor and of preventing the reset time of the output signal from becoming long over time.

Second Embodiment

A shift register according to a second embodiment of the present invention has the same configuration (FIG. 2) as the shift register according to the first embodiment, but includes a unit circuit different from that of the shift register according to the first embodiment. In the following, differences between this embodiment and the first embodiment will be described, and the features provided in common with the first embodiment will not be described.

Figure 9:
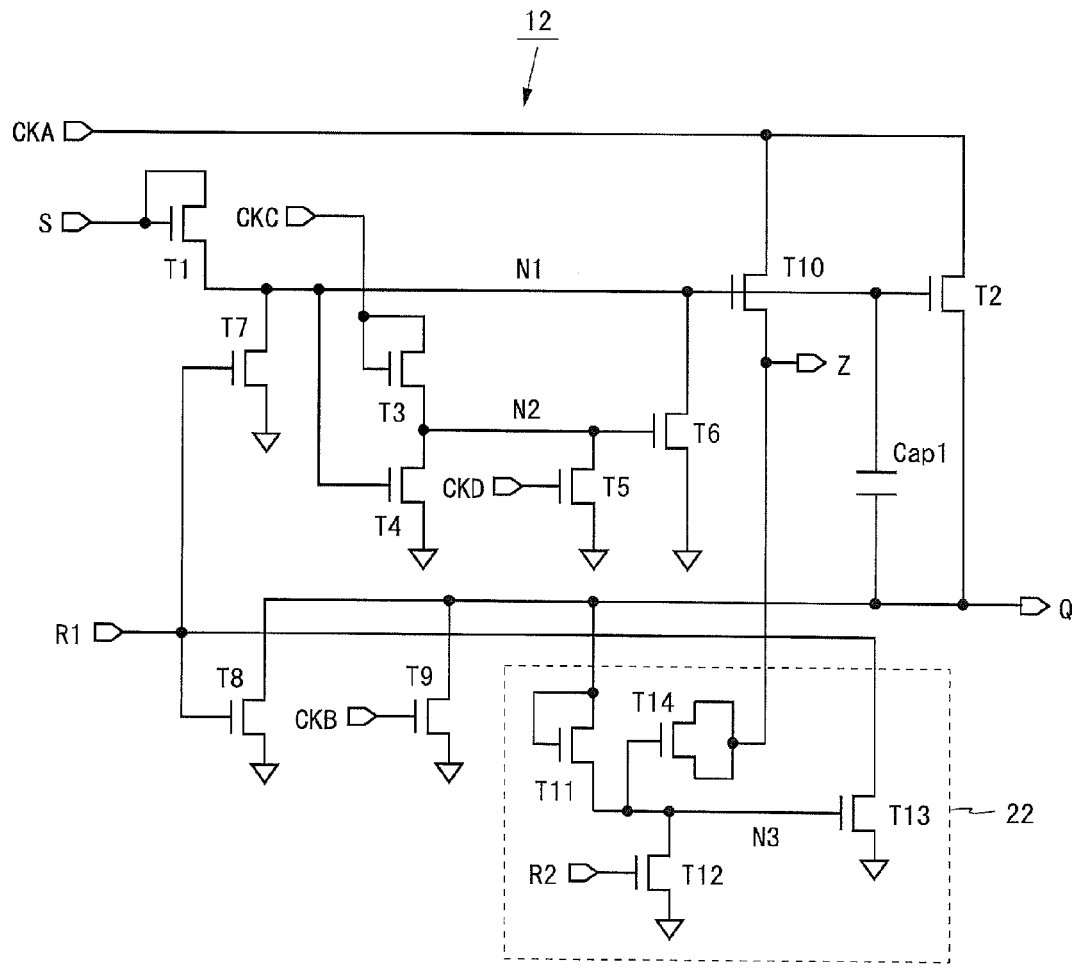
FIG. 9 is a circuit diagram of a unit circuit included in a shift register according to a second embodiment of the present invention.

FIG. 9 is a circuit diagram of a unit circuit included in the shift register according to this embodiment. A unit circuit 12 illustrated in FIG. 9 is configured such that the capacitor Cap2 of the unit circuit 11 according to the first embodiment is replaced with a TFT T14. In the unit circuit 12, the TFTs T11 to T14 constitute a compensation circuit 22. A drain terminal and a source terminal of the TFT T14 are connected to the source terminal of the transistor T10 and the additional output terminal Z. A gate terminal of the transistor T14 is connected to the node N3. The TFT T14 thus connected has the same function as the capacitor Cap2. The shift register according to this embodiment operates in the same manner as the shift register according to the first embodiment.

Therefore, according to the shift register of this embodiment, similarly to the first embodiment, it is possible to reduce the threshold voltage shift of the output reset transistor, and to prevent the reset time of the output signal from becoming long over time. Further, a capacitor included in the compensation circuit 22 is configured by a TFT having a drain terminal and a source terminal short-circuited to provide one electrode and a gate terminal as the other electrode. By configuring the capacitor included in the compensation circuit 22 by a TFT, it is possible to reduce manufacturing cost of the shift register.

Third Embodiment

Figure 10:
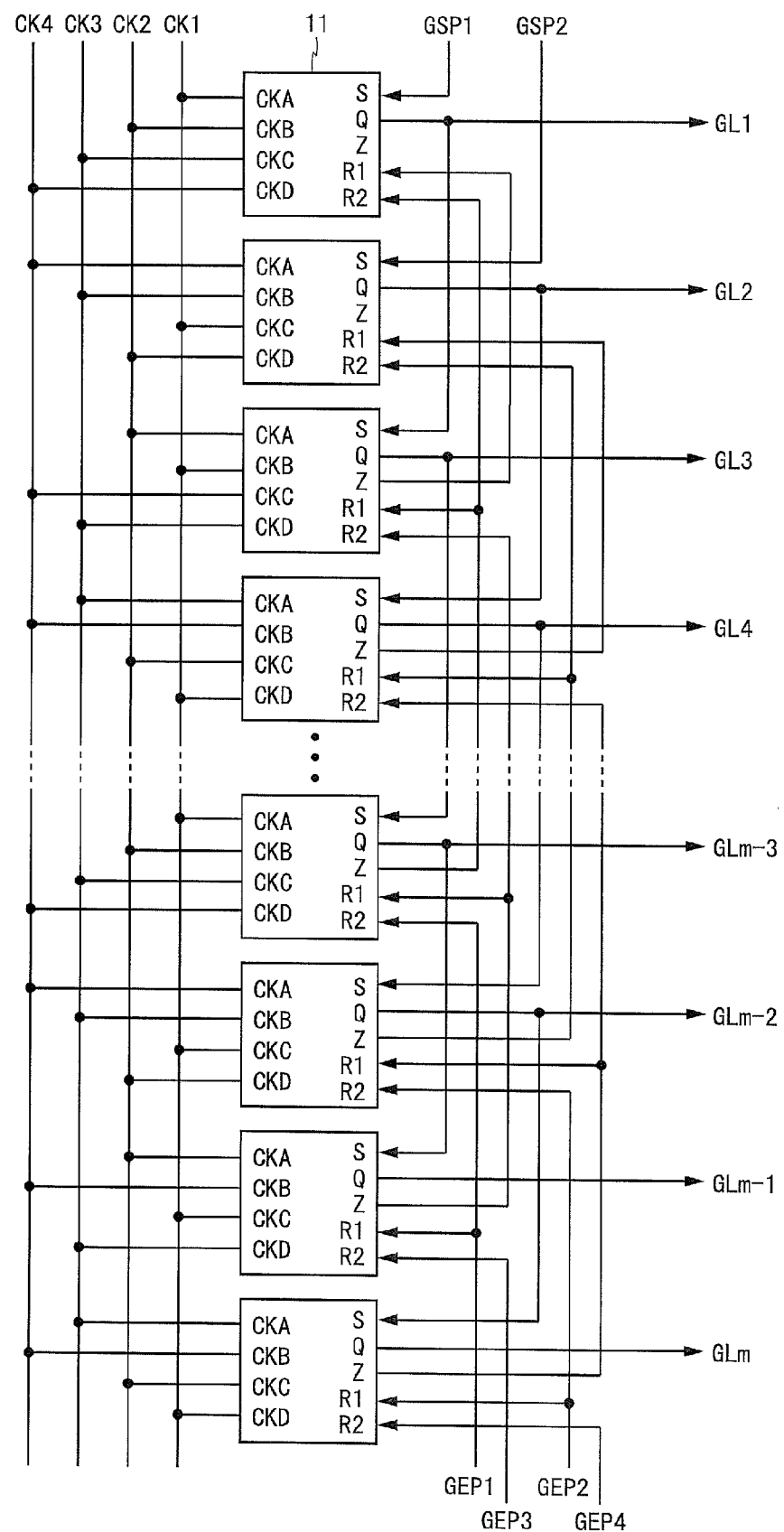
FIG. 10 is a block diagram illustrating a configuration of a shift register according to a third embodiment of the present invention.

FIG. 10 is a block diagram illustrating a configuration of a shift register according to a third embodiment of the present invention. FIG. 10 shows m unit circuits 11 arranged one-dimensionally. A first shift register is configured by cascade-connecting odd-numbered unit circuits 11 out of the m unit circuits 11. Further, a second shift register is configured by cascade-connecting even-numbered unit circuits 11. In the following, differences between this embodiment and the first embodiment will be described, and the features provided in common with the first embodiment will not be described. In this embodiment, m is assumed to be a multiple of 4.

The two shift registers shown in FIG. 10, are supplied with the four clock signals CK1 to CK4 as the gate clock signal GCK, a first gate start pulse signal GSP1 and a second gate start pulse signal GSP2 as the gate start pulse signal GSP, and first to fourth gate end pulse signals GEP1 to GEP4 as the gate end pulse signal GEP.

When k is assumed to be an integer not smaller than 1 and not greater than (m/4), a (4k−3)-th unit circuit UC(4k−3) is supplied with the clock signals CK1, CK2, CK3, and CK4 respectively as the clock signals CKA, CKB, CKC, and CKD. A (4k−2)-th unit circuits UC(4k−2) is supplied with the clock signals CK4, CK3, CK1, and CK2 respectively as the clock signals CKA, CKB, CKC, and CKD. A (4k−1)-th unit circuit UC(4k−1) is supplied with the clock signals CK2, CK1, CK4, and CK3 respectively as the clock signals CKA, CKB, CKC, and CKD. A 4k-th unit circuit UC(4k) is supplied with the clock signals CK3, CK4, CK2, and CK1 respectively as the clock signals CKA, CKB, CKC, and CKD.

To the first unit circuit UC(1), the first gate start pulse signal GSP1 is inputted as the set signal S. To a second unit circuit UC(2), the second gate start pulse signal GSP2 is inputted as the set signal S. To the unit circuit UC(i) that is neither the first unit circuit nor the second unit circuit, the output signal Q outputted from a second previous unit circuit UC(i−2) is inputted as the set signal S.

To an (m−3)-th unit circuit UC(m−3), the first gate end pulse signal GEP1 is inputted as the second reset signal R2. To an (m−2)-th unit circuit UC(m−2), the second gate end pulse signal GEP2 is inputted as the second reset signal R2. To an (m−1)-th unit circuit UC(m−1), the first gate end pulse signal GEP1 is inputted as the first reset signal R1, and the third gate end pulse signal GEP3 is inputted as the second reset signal R2. To the m-th unit circuit UC(m), the second gate end pulse signal GEP2 is inputted as the first reset signal R1, and the fourth gate end pulse signal GEP4 is inputted as the second reset signal R2. To a unit circuit UC(i) that is neither the (m−1)-th unit circuit nor the m-th unit circuit, the additional output signal Z outputted from a second next unit circuit UC(i+2) is inputted as the first reset signal R1. To a unit circuit UC(i) that is not any of the (m−3)-th to m-th unit circuits, the additional output signal Z outputted from a fourth next unit circuit UC(i+4) is inputted as the second reset signal R2. The i-th scanning signal line GLi is driven based on the output signal Q outputted from the i-th unit circuit UC(i).

In the first shift register configured by the odd-numbered unit circuits 11, the second previous unit circuit corresponds to the previous stage unit circuit, and the second next unit circuit corresponds to the next stage unit circuit. This also applies to the second shift register configured by the even-numbered unit circuits 11. As described above, in each of the two shift registers illustrated in FIG. 10, each stage unit circuit is supplied with the output signal Q outputted from the previous stage unit circuit as the set signal S, the additional output signal Z outputted from the next stage unit circuit as the first reset signal R1, and the additional output signal Z outputted from the second next stage unit circuit as the second reset signal R2.

Figure 11:
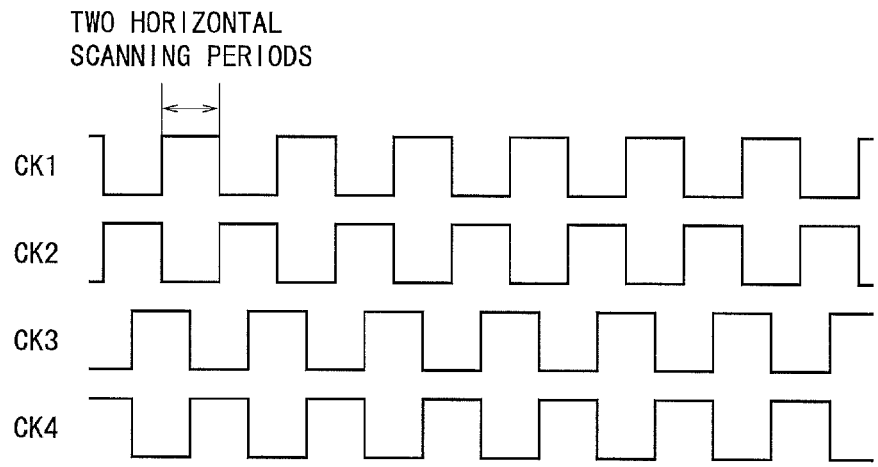
FIG. 11 is a timing chart of clock signals supplied to the shift register illustrated in FIG. 10.

FIG. 11 is a timing chart of the clock signals CK1 to CK4. As illustrated in FIG. 11, each of the clock signals CK1 to CK4 becomes a high level every other two horizontal scanning periods. Relations between the phases of the clock signals CK1 to CK4 are the same as those in the first embodiment. The configuration of the unit circuit 11 is the same as that in the first embodiment (see FIG. 4). The timing chart of the unit circuit 11 is the same as that shown in FIG. 5 other than that the one horizontal scanning period is changed to the two horizontal scanning periods.

The clock signals of four phases illustrated in FIG. 11 are applied to the two shift registers illustrated in FIG. 10, and the first and second gate start pulse signals GSP1 and GSP2, and the first to fourth gate end pulse signals GEP1 to GEP4 are controlled to be a high level for two horizontal scanning periods at predetermined timing. With this, a pulse applied to a first stage (first unit circuit UC(1)) of the first shift register is sequentially transferred to a final stage ((m−1)-th unit circuit UC(m−1)) of the first shift register, and a pulse applied to a first stage (second unit circuit UC(2)) of the second shift register is sequentially transferred to a final stage (m-th unit circuit UC(m)) of the second shift register. At this time, the potentials of the scanning signal lines GL1 to GLm are changed to a high level sequentially for two horizontal scanning periods delaying by one horizontal scanning period (see FIG. 12).

Figure 12:
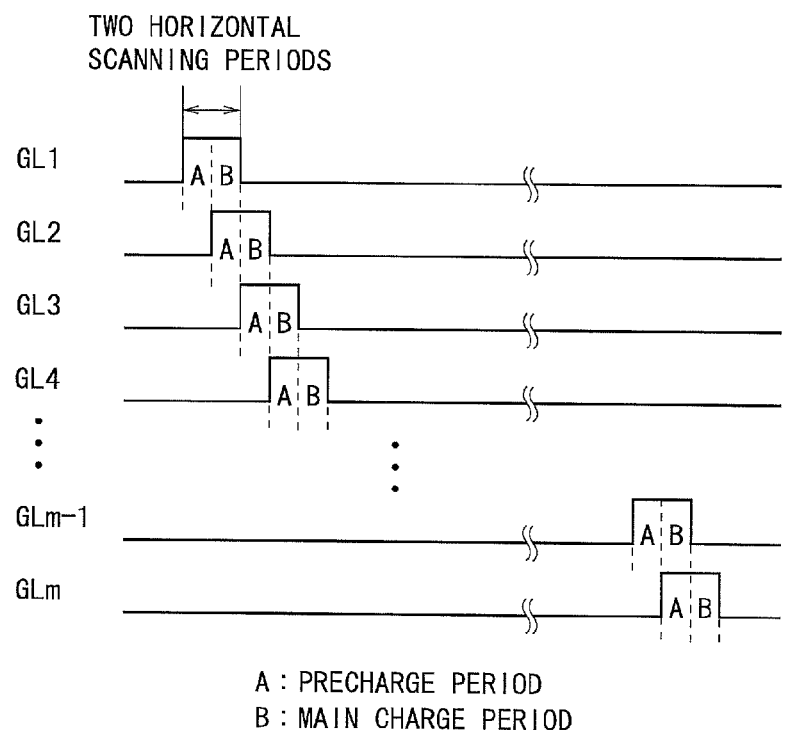
FIG. 12 is a timing chart of signals outputted from the shift register illustrated in FIG. 10.
Figure 13:
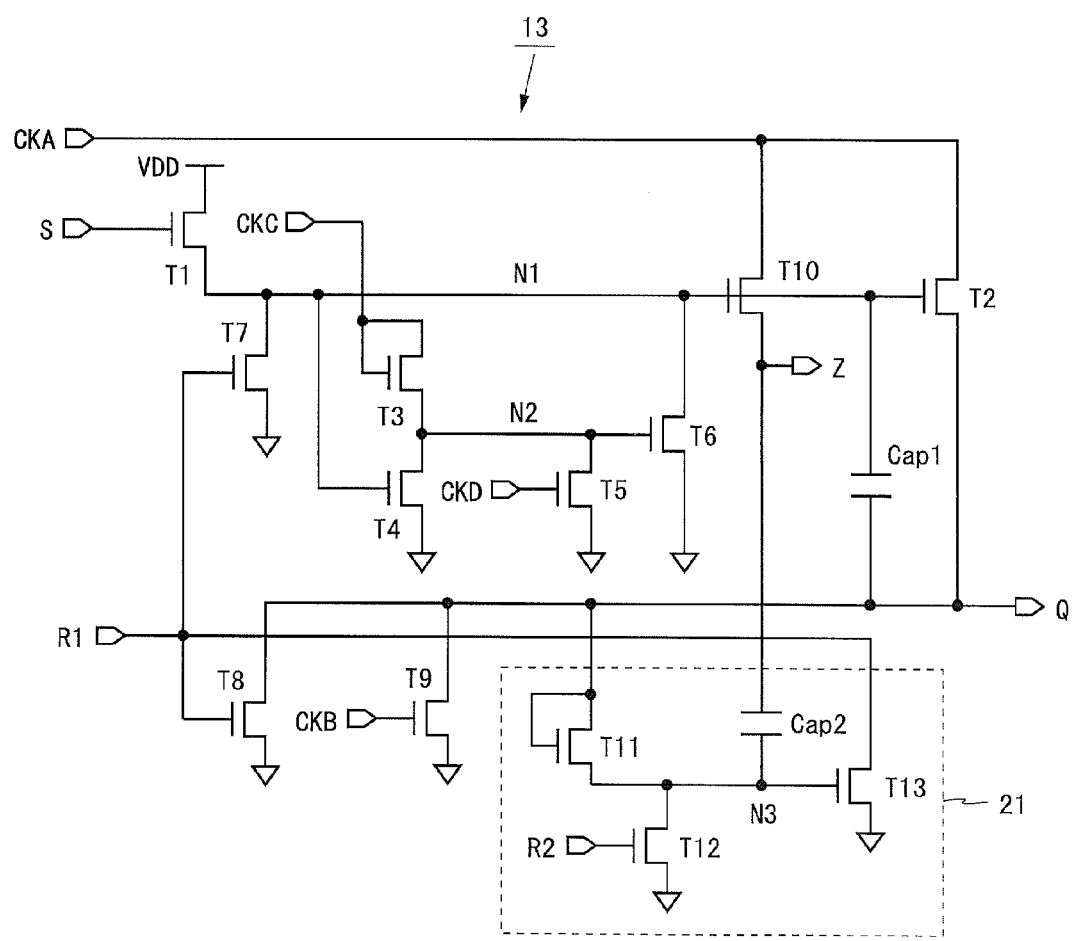
FIG. 13 is a circuit diagram of a unit circuit included in a shift register according to a first modified example of the present invention.
Figure 14:
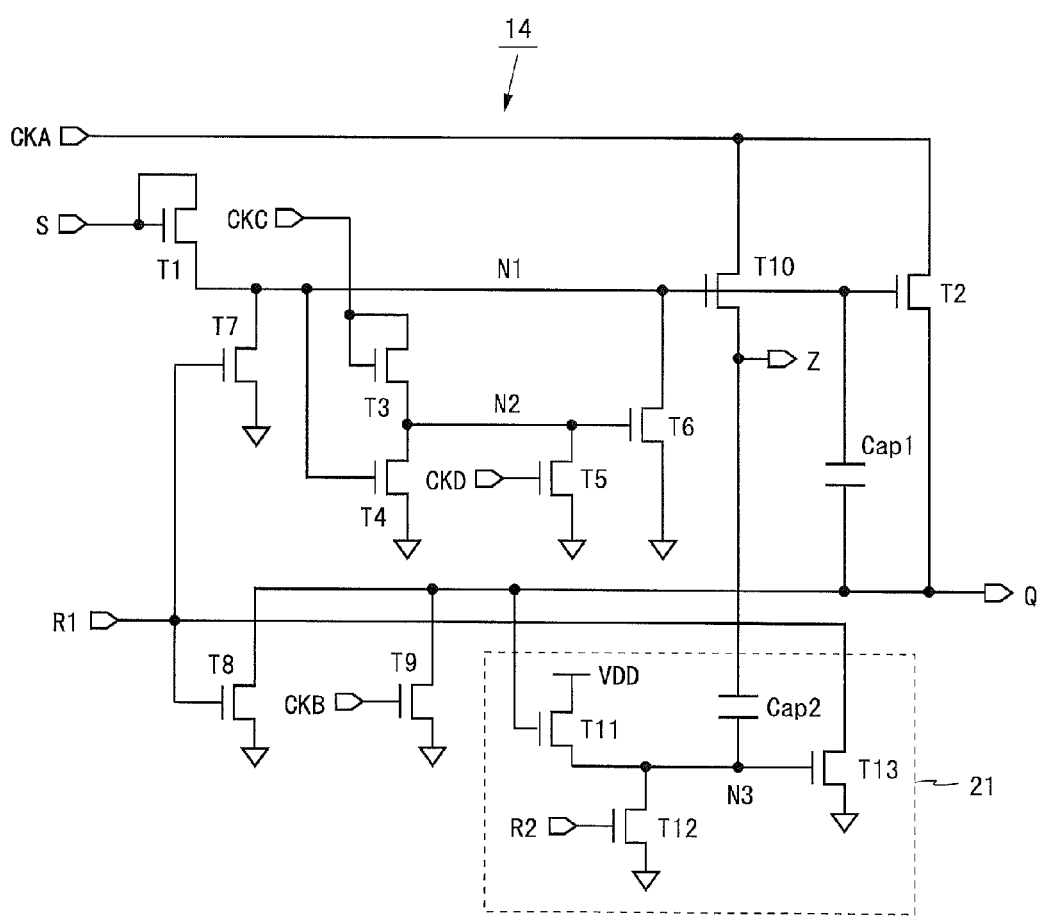
FIG. 14 is a circuit diagram of a unit circuit included in a shift register according to a second modified example of the present invention.
Figure 15:
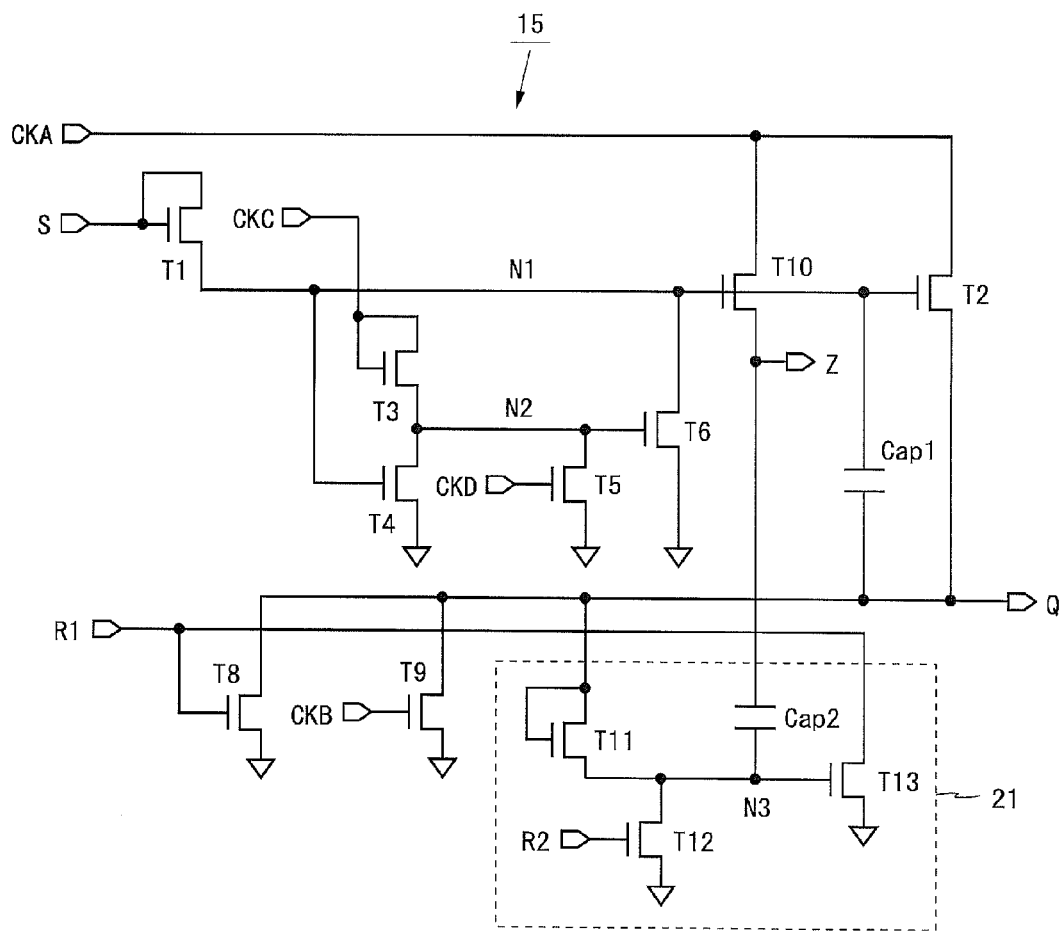
FIG. 15 is a circuit diagram of a unit circuit included in a shift register according to a third modified example of the present invention.
Figure 16:
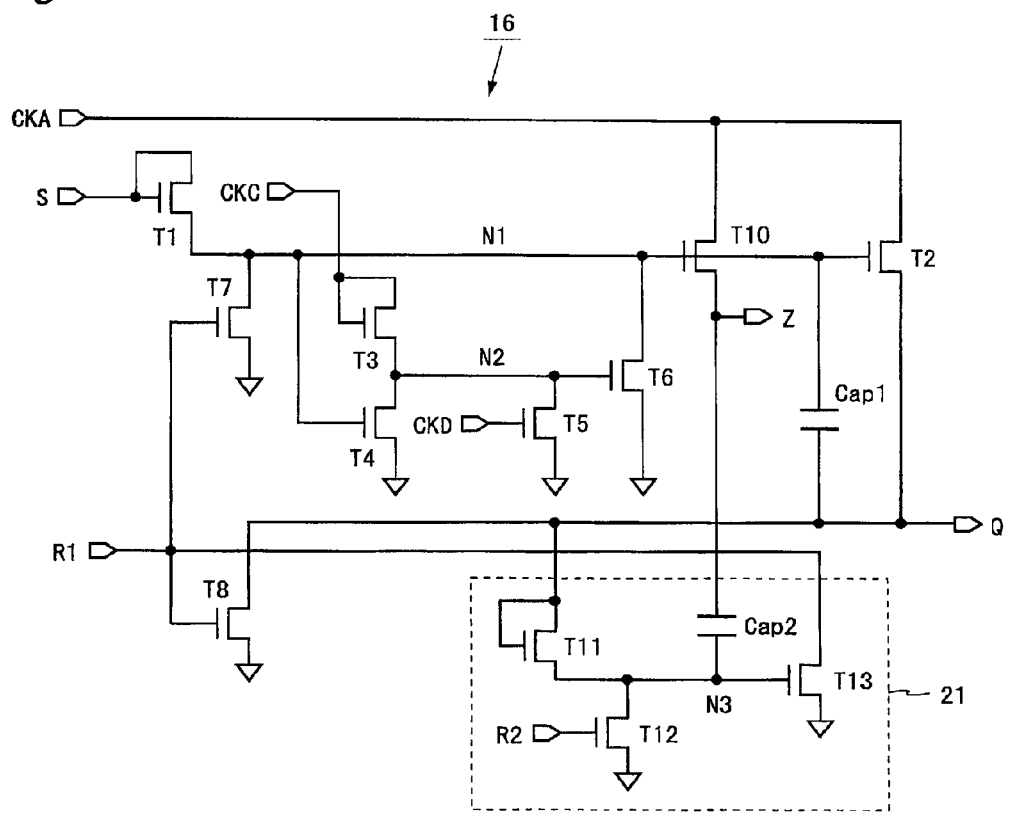
FIG. 16 is a circuit diagram of a unit circuit included in a shift register according to a fourth modified example of the present invention.
Figure 17:
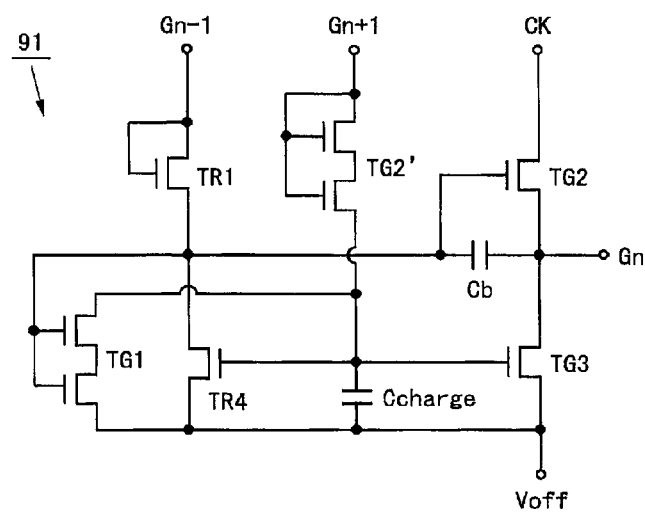
FIG. 17 is a circuit diagram of a unit circuit included in a conventional shift register.

As illustrated in FIG. 12, the selection period of the i-th scanning signal line GLi is divided into two periods of a first half and a latter half. In the first half, the scanning signal line GLi and a previous scanning signal line GLi-1 are selected, and precharge (preliminary charge) to the scanning signal line GLi is performed. In the latter half, the scanning signal line GLi and a next scanning signal line GLi+1 are selected, and main charge (primary charge) to the scanning signal line GLi is performed.

Similarly to the first embodiment, the unit circuit 11 of the shift register according to this embodiment includes the compensation circuit 21 configured to apply the overshoot potential Vos of a polarity opposite to the ON potential taking the OFF potential as a reference, to the additional output terminal Z at predetermined timing. Therefore, similarly to the first embodiment, according to the shift register of this embodiment, it is possible to reduce the threshold voltage shift of the output reset transistor, and to prevent the reset time of the output signal from becoming long over time.

It should be noted that the shift register according to the embodiments of the present invention can be configured as modified examples described below. For example, in place of the unit circuit 11 or 12 illustrated in FIG. 4 and FIG. 9, any of unit circuits 13 to 16 respectively illustrated in FIG. 13 to FIG. 16 may be cascade-connected. Each of the unit circuits 13 to 16 includes the compensation circuit 21 configured to apply the overshoot potential Vos of a polarity opposite to the ON potential taking the OFF potential as a reference, to the additional output terminal Z at predetermined timing.

In the unit circuit 13 (FIG. 13), the set signal S is supplied to the gate terminal of the TFT T1 (the control terminal of the input transistor), and a high level potential VDD is fixedly applied to the drain terminal of the TFT T1 (one of the conducting terminals of the input transistor). Also in this circuit configuration, the ON potential can be applied to the gate terminal of the TFT T2 using the TFT T1. In the unit circuit 14 (FIG. 14), the gate terminal of the TFT T11 is connected to the output terminal Q, and the high level potential VDD is fixedly applied to the drain terminal of the TFT T11. Also in this circuit configuration, the ON potential can be applied to the node N3 using the TFT T11. The unit circuit 15 (FIG. 15) does not include the TFT T7 (state reset transistor). The unit circuit 16 (FIG. 16) does not include the TFT T9 (output reset auxiliary transistor). Using the unit circuits 15 or 16 allows reduction of an amount of circuits. Alternatively, unit circuits each configured by freely combining features of the unit circuits 11 to 16 may be cascade-connected unless contrary to the nature thereof.

Further, not only supplying the additional output signal Z to a second previous stage unit circuit as the second reset signal R2 while supplying the additional output signal Z to the previous stage unit circuit as the first reset signal R1, the additional output signal Z may also be supplied to the next stage unit circuit as the set signal S. Further, all of the transistors included in the unit circuits may be of a P-channel type. Alternatively, each unit circuit may be configured by P-channel type transistors and N-channel type transistors. Further, the present invention can be applied to a shift register included in a display device other than the liquid crystal display device, an imaging device, or the like.

INDUSTRIAL APPLICABILITY

The shift register according to the present invention has a characteristic of preventing the reset time of the output signal from becoming long over time, and therefore can be applied to various electronic circuits such as a drive circuit in a display device and a drive circuit in an imaging device.

DESCRIPTION OF REFERENCE CHARACTERS

1: POWER SUPPLY
2: DC/DC CONVERTER
3: DISPLAY CONTROL CIRCUIT
4: SCANNING SIGNAL LINE DRIVE CIRCUIT
5: VIDEO SIGNAL LINE DRIVE CIRCUIT
6: COMMON ELECTRODE DRIVE CIRCUIT
7: PIXEL REGION
8: LIQUID CRYSTAL PANEL
11 TO 16: UNIT CIRCUIT
21, 22: COMPENSATION CIRCUIT

The invention claimed is:
1. A shift register configured such that a plurality of unit circuits are cascade-connected and operating based on a plurality of clock signals, wherein
each unit circuit includes:
an output transistor having one conducting terminal supplied with one of the clock signals and the other conducting terminal connected to an output node;
an input transistor configured to apply an ON potential to a control terminal of the output transistor according to a set signal that has been supplied;

an output reset transistor configured to apply an OFF potential to the output node according to an output reset signal that has been supplied;

an additional output transistor having a control terminal and one conducting terminal connected in an identical configuration with that of the output transistor, and having the other conducting terminal connected to an additional output node; and a compensation circuit configured to apply a compensation potential to the additional output node at predetermined timing, a polarity of the compensation potential being opposite to that of the ON potential taking the OFF potential as a reference, and the output reset transistor is supplied with a signal outputted from an additional output node included in a next stage unit circuit as the output reset signal.

2. The shift register according to claim 1, wherein the compensation circuit includes:

a first transistor configured to apply the ON potential to an internal node according to a signal outputted from the output node;

a second transistor configured to apply the OFF potential to the internal node according to a compensation control signal that has been supplied; and a capacitor provided between the internal node and the additional output node.

3. The shift register according to claim 2, wherein the compensation circuit further includes a third transistor having one conducting terminal supplied with the output reset signal and a control terminal connected to the internal node.

4. The shift register according to claim 2, wherein the second transistor is supplied with a signal outputted from an additional output node included in a second next stage unit circuit as the compensation control signal.

5. The shift register according to claim 2, wherein the capacitor is configured as a thin film transistor in which two conducting terminals are short-circuited to provide one electrode and a control terminal is provided as the other electrode.

6. The shift register according to claim 2, wherein the signal outputted from the output node is supplied to a control terminal and one conducting terminal of the first transistor.

7. The shift register according to claim 2, wherein the signal outputted from the output node is supplied to a control terminal of the first transistor, and the ON potential is fixedly applied to one conducting terminal of the first transistor.

8. The shift register according to claim 1, wherein the compensation circuit applies the compensation potential to the additional output node every time when the ON potential is applied to the additional output node.

9. The shift register according to claim 1, wherein each unit circuit further includes a state reset transistor configured to apply the OFF potential to the control terminal of the output transistor according to a state reset signal that has been supplied.

10. The shift register according to claim 1, wherein each unit circuit further includes an output reset auxiliary transistor configured to apply the OFF potential to the output node according to a different one of the clock signals that has been supplied.

11. The shift register according to claim 1, wherein the set signal is supplied to a control terminal and one conducting terminal of the input transistor.

12. The shift register according to claim 1, wherein the set signal is supplied to a control terminal of the input transistor, and the ON potential is fixedly applied to one conducting terminal of the input transistor.

13. The shift register according to claim 1, wherein the input transistor is supplied with a signal outputted from a previous stage unit circuit as the set signal.

14. The shift register according to claim 1, wherein all of the transistors included in the unit circuits are of the same conductivity type.

15. A display device comprising:

a plurality of pixel circuits arranged two-dimensionally; and a drive circuit including the shift register according to claim 1.

16. The shift register according to claim 1, wherein the transistors included in the unit circuits are formed using oxide semiconductor.

* * * * *